US008103018B2

(12) United States Patent
Homma

(10) Patent No.: US 8,103,018 B2
(45) Date of Patent: Jan. 24, 2012

(54) SOUND PICKUP APPARATUS

(75) Inventor: Shigeru Homma, Hamamatsu (JP)

(73) Assignee: Yamaha Corporation (JP)

( * ) Notice: Subject to any disclaimer, the term of this patent is extended or adjusted under 35 U.S.C. 154(b) by 541 days.

(21) Appl. No.: 12/376,682

(22) PCT Filed: Aug. 2, 2007

(86) PCT No.: PCT/JP2007/065173
§ 371 (c)(1),
(2), (4) Date: Feb. 6, 2009

(87) PCT Pub. No.: WO2008/018362
PCT Pub. Date: Feb. 14, 2008

(65) Prior Publication Data

US 2010/0046763 A1 Feb. 25, 2010

(30) Foreign Application Priority Data

Aug. 7, 2006 (JP) ................................ 2006-214691

(51) Int. Cl.
*H01L 3/00* (2006.01)
(52) U.S. Cl. ........................................... 381/92; 381/56
(58) Field of Classification Search .................... 381/57; 700/94
See application file for complete search history.

(56) References Cited

U.S. PATENT DOCUMENTS 5,335,011 A 8/1994 Addeo et al.
7,190,775 B2 * 3/2007 Rambo .................... 379/202.01
7,991,167 B2 * 8/2011 Oxford ........................... 381/92
2003/0161485 A1 * 8/2003 Smith ............................ 381/92
2004/0175006 A1 * 9/2004 Kim et al. ........................ 381/92
2009/0274318 A1 * 11/2009 Ishibashi et al. ................ 381/92
2009/0310794 A1 * 12/2009 Ishibashi et al. ................ 381/66

FOREIGN PATENT DOCUMENTS

JP 8-505745 A 6/1996
JP 10-116099 A 5/1998
JP 2000-137498 A 5/2000
JP 2005-266411 A 9/2005

OTHER PUBLICATIONS

International Telecommunication Union; ITU-T G.711 Appendix II, "Series G: Transmission Systems and Media, Digital Systems and Networks"; Feb. 2000, 16 pages.
R. Zopf, Lucent Technologies, Request for Comments: 3389; "Real-time Transport Protocol (RTP) Payload for Comfort Noise (CN)"; Sep. 2002, pp. 1-9.
International Search Report (ISR) issued in related PCT/JP2007/065173, mailed Nov. 6, 2007.

* cited by examiner

*Primary Examiner* — Benjamin Sandvik
(74) *Attorney, Agent, or Firm* — Rossi, Kimms & McDowell LLP

(57) ABSTRACT

An A/D converter sets a sound pickup signal to low sensitivity and inputs the signal to a sound pickup beam generation unit. The A/D converter sets a sound pickup signal to high sensitivity and inputs the signal to the sound pickup beam generation unit. A sound detector determines from the sound pickup beam whether or not sound is present and whether or not clipping has arisen. A control unit inputs a determination result from the sound detector, thereby setting an encoder such that a low-level sound pickup beam signal is output to the outside when a high-level sound pickup beam signal is clipped.

5 Claims, 4 Drawing Sheets

SOUND PICKUP APPARATUS

This application is a U.S. National Phase Application of PCT International Application PCT/JP2007/065173 filed on 02 Aug. 2007, which is based on and claims priority from JP 2006-214691 filed on 07 Aug. 2006, the content of which is incorporated herein in its entirety by reference.

TECHNICAL FIELD

The present invention relates to a sound pickup apparatus that is used in a conference to pick up voice of participants in the conference.

BACKGROUND ART

An IP phone, and the like, has recently been equipped with VAD (Voice Activity Detection) as a function for detecting presence/absence of a sound. Many phones are equipped with DTX (discontinuous transmission) as a function for not transmitting sound information during silence (see; for instance, Non-Patent Document 1 and Non-Patent Document 2). It is possible to decrease the amount of information to be transmitted (an average bit rate) by adoption of a configuration (hereinafter called "silence suppression") that does not transmit sound information during silence. However, performance of silence suppression raises a problem of a break arising in the start of a sound when there occurs a shift from silence to presence of a sound.

Accordingly, there has been proposed a sound compression method for temporarily storing a picked-up sound in memory and reading the past sound from the memory when a change from silence to a sound occurs and transmitting the thus-read sound, thereby preventing occurrence of a break in sound, which would otherwise arise at start-up (see; for instance, Patent Document 1).

Non-Patent Document 1: ITU-T G.711 Appendix II to Recommendation G.711 (02/2000)

Non-Patent Document 2: RFC3389 Real-time Transport Protocol (RTP) Payload for Comfort Noise (CN)

Patent Document 1: JP-A-2005-266411

DISCLOSURE OF THE INVENTION

Problem That the Invention is to Solve

However, the method described in connection with Patent Document 1 encounters a problem of the difficulty in detecting a sound at start-up when an appropriate audio signal cannot be acquired for reasons of a deficiency in the sensitivity of a microphone. In the meantime, when the sensitivity of the microphone is increased to detect a sound at start-up, a period of silence may erroneously be perceived as a period of a sound. Moreover, when the sensitivity of the microphone is increased and when a large sound is input at start-up, there arises a problem of the sound exceeding an allowable input limit (occurrence of clipping).

The present invention aims at providing a sound pickup apparatus that accurately detects a sound at start-up when silence suppression is performed and that does not induce clipping even when a large sound is input at start-up.

Means for Solving the Problem

A sound pickup apparatus of the present invention is characterized by comprising:

a microphone array formed from an arrangement of a plurality of microphones;

signal distribution means that inputs audio signals picked by means of the plurality of microphones and that distributively outputs the audio signal;

first and second sound pickup signal processing means that respectively generate first and second sound pickup beams exhibiting directivity toward a single area in accordance with the audio signals distributively output by the signal distribution means;

level setting means that sets to a high level sensitivity of the first sound pickup beam generated by the first sound pickup signal processing means and that sets to a low level sensitivity of the second sound pickup beam generated by the second sound pickup signal processing means;

first and second memory that respectively store the first and second sound pickup beams generated by the first and second sound pickup signal processing means;

a sound determination unit that detects a signal level of the first sound pickup beam generated by the first sound pickup signal processing means and a signal level of the second sound pickup beam generated by the second sound pickup signal processing means, that determines whether or not sound is present from the detected signal level, and that detects whether or not the first sound pickup beam exceeds an allowable input limit;

a selector that reads the sound pickup beams stored in the first and second memory and that selectively outputs any of the sound pickup beams; and a control unit that makes a setting such that, when the sound determination unit does not detect that the first sound pickup beam exceeds the allowable input limit, a high-sensitivity sound pickup beam stored in the first memory is output to the selector at timing at which a determination is switched from silence to presence of sound and such that, when the sound determination unit detects that the first sound pickup beam exceeds the allowable input limit, the second sound pickup beam stored in the second memory is output to the selector at timing when a determination is changed from silence to presence of sound.

In the present configuration, the signal distribution means distributively outputs the audio signals picked by the plurality of microphones to the first and second sound pickup signal processing means. The first and second sound pickup signal processing means generate first and second sound pickup beams, and these sound pickup beams are set to high sensitivity and low sensitivity, respectively. A high-sensitivity sound pickup beam and a low-sensitivity sound pickup beam are stored in memory, respectively. The selector reads, in sequence from the past, any of sound pickup beams stored in memory at timing designated by the control unit, and outputs the thus-read sound pickup beam. The sound determination unit detects whether or not sound is present in the sound pickup beam and detects a sound pickup beam that exceeds an allowable input limit (causes clipping). The control unit inputs a determination result from the sound determination unit. In a case where the sound pickup beam is not clipped, when a determination result showing a change from silence to presence of sound is input, the control unit makes a setting on the selector so as to select and read a high-sensitivity sound pickup beam. Further, in a case where the sound pickup beam is clipped, when a determination result showing a change from silence to presence of sound is input, the control unit makes a setting on the selector so as to select and read a low-sensitivity sound pickup beam.

Further, the sound pickup apparatus of the present invention is characterized in that, when the sound determination unit holds a determination showing presence of sound for a predetermined period of time or longer, the control unit performs normal output processing for commanding the signal distribution means to output audio signals picked by all microphones to single sound pickup signal processing means; commanding the level setting means to set the sound pickup beam generated by the sound pickup signal processing means to high sensitivity; and commanding the selector to output a high-sensitivity sound pickup beam.

In the configuration, when a determination result showing presence of sound is stably input for a given period of time or longer, there is perform normal output processing for generating a single high-sensitivity sound pickup beam from sound picked by all of the microphones and outputting the sound pickup beam. Thereby, when sound is stably determined to be present, voice sound is output reliably.

The sound pickup apparatus of the present invention is characterized in that, when the sound determination unit changes a determination from presence of sound to silence, the control unit changes processing from the normal output processing to a detection mode for commanding the signal distribution means to distributively output the audio signal to the first and second signal processing means; commanding the level setting means to set the sensitivity of the sound pickup beam generated by the first sound pickup signal processing means to high sensitivity and to set the sensitivity of the sound pickup beam generated by the second sound pickup signal processing means to low sensitivity; and setting the selector so as to output the high-sensitivity sound pickup beam at timing, at which the determination is changed from silence to presence of sound, when the sound determination unit does not detect the sound pickup beam that exceeds the allowable input limit and output the low-sensitivity sound pickup beam at timing, at which the determination is changed from silence to presence of sound, when the sound determination unit detects the sound pickup beam that exceeds the allowable input limit.

In this configuration, when a determination result showing silence is input in a state where the determination result showing presence of sound is stably input for a given period of time or longer, there arises a change from the normal output processing to a detection mode for detecting a change from silence to presence of sound by use of high-sensitivity. and low-sensitivity sound pickup beams.

The sound pickup apparatus of the present invention is characterized in that the level setting means changes levels of audio signals picked by the plurality of microphones and inputs the audio signals to the sound pickup signal processing means, thereby setting the sound pickup beams to high sensitivity or low sensitivity.

The sound pickup apparatus of the present invention is also characterized in that the level setting means changes a ratio of an input level to an output level of each of the sound pickup signal processing means, thereby setting the sound pickup beams to high sensitivity or low sensitivity, respectively.

Advantage of the Invention

According to the present invention, a low-sensitivity sound pickup beam and a high-sensitivity sound pickup beam are set, and timing for a change from silence to presence of sound is reliably detected by the high-sensitivity sound pickup beam. When the high-sensitivity sound pickup beam is clipped, the output is switched to the low-sensitivity sound pickup beam, thereby accurately detecting sound at start-up. Even when big sound is input at start-up, clipping does not occur.

101: HOUSING, 11 TO 18: MICROPHONE, 21: INPUT-AND-OUTPUT I/F, 22: AMPLIFIER FOR SOUND PICKUP, 23: A/D CONVERTER, 24: DIGITAL AUDIO PATCH, 25A, 25B: SOUND PICKUP BEAM GENERATION UNITS, 26A, 26B: FIFO MEMORY, 27: SOUND DETECTOR, 28: CONTROL UNIT, 29: ENCODER

BEST MODE FOR IMPLEMENTING THE INVENTION

A sound pickup apparatus of an embodiment of the present invention delays audio signals picked by a plurality of microphones for a given period of time and combines the thus-delayed signal, to thus generate a sound pickup beam (signal) into which sounds in a specific area with high sensitivity are gathered. Presence of a sound or silence (presence or absence of voice) is detected by monitoring a signal level of the sound pickup beam. Audio signals, into which sounds are gathered by all microphones when presence of a sound is stably detected over a predetermined period of time or more, are delayed for a given period of time and combined together, to thus generate a sound pickup beam (this is taken as a normal mode). In the meantime, when voice is not picked up, audio signals picked by respective microphones are distributively input to signal processing units that are (functionally) separated into two units, and the respective signal processing units generate sound pickup beams having different sensitivity levels associated with a single sound pickup area. In this case, a shift from silence to presence of a sound is detected by means of a high-sensitivity sound pickup beam. When a signal level of a high-sensitivity sound pickup beam is clipped, a low-sensitivity sound pickup beam is output to a subsequent stage (this is taken as a VAD mode).

The sound pickup apparatus of the embodiment of the present invention will be described hereunder by reference to the drawings.

Figure 1:
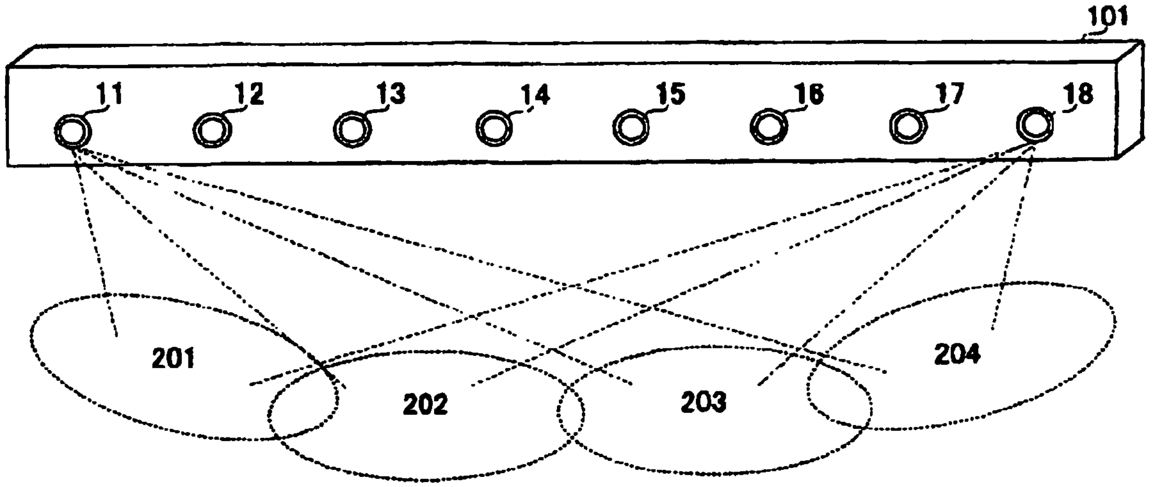
FIG. 1 is a view showing the layout of microphones in a sound pickup apparatus of an embodiment.

FIG. 1 is a view showing the layout of microphones of the sound pickup apparatus of the present embodiment.

The sound pickup apparatus of the present embodiment has. a plurality of microphones 11 to 18 provided in a housing 101.

The housing 101 assumes a substantially-rectangular-parallelepiped shape that is lengthy in one direction. In the following descriptions, among four side surfaces of the housing 101, lengthy surfaces are referred to as long surfaces, and shorter surfaces are referred to as short surfaces.

The microphones 11 to 18 having the same specifications are provided in one of the long surfaces of the housing 101. The microphones 11 to 18 are linearly disposed at given intervals along the long direction, thereby constituting a microphone array.

Although the number of microphones of the microphone array is set to eight in the present embodiment, the number of microphones is not limited to eight. It would be better to change the number of microphones according to specifications. Moreover, the interval among the microphones of the microphone array may also not be constant. For instance, there may also be a mode in which microphones are densely arranged in the center and sparsely arranged toward both ends along the longitudinal direction.

The microphone array consisting of the microphones 11 to 18 generates sound pickup beams with high directivity toward specific areas 201 to 204. The sound pickup apparatus of the present embodiment delays sounds picked by the respective microphones of the microphone array by respective predetermined periods of time and combines the thus-delayed audio signals together, thereby generating a plurality of sound pickup beams associated with the specific areas 201 to 204. Detailed descriptions will be provided later.

Figure 2:
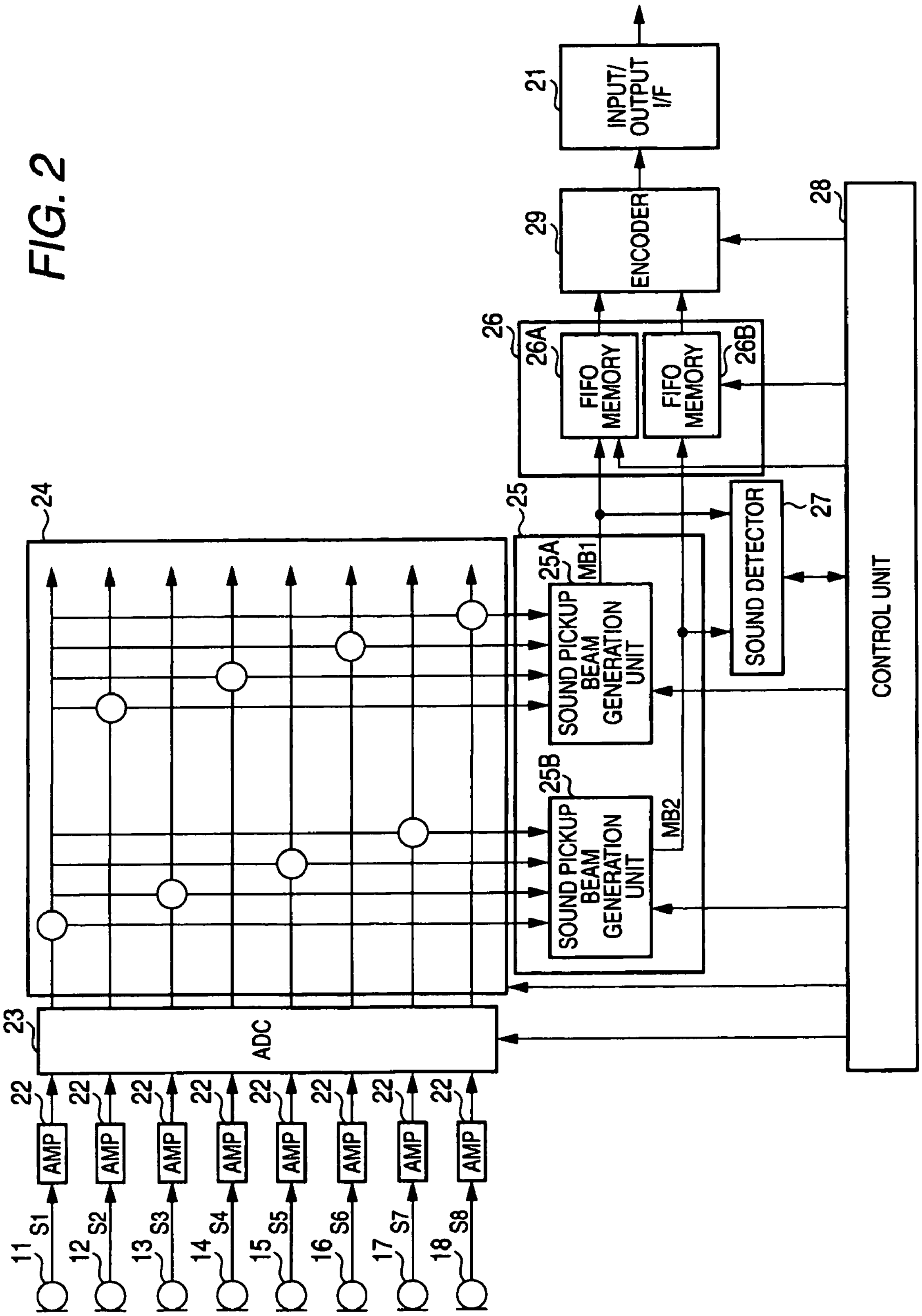
FIG. 2 is a block diagram showing the configuration of the sound pickup apparatus of the embodiment.

FIG. 2 is a block diagram showing the configuration of the sound pickup apparatus of the present embodiment. The block diagram shown in FIG. 2 shows a channel for processing one of a plurality of sound pickup beams. As shown in FIG. 2, the sound pickup apparatus of the present embodiment has the microphones 11 to 18; the input/output I/F 21; a plurality of front-end amplifiers 22 (eights in the drawing); an 8-channel A/D converter 23; a digital audio patch 24; a sound pickup beam generation unit 25 (25A and 25B); FIFO memory 26 (26A and 26B); a sound detector 27; a control unit 28; and an encoder 29. Each of the sound pickup beam generation unit 25 and the FIFO memory 26 operates as a single constituent element in a normal mode; however, each of them is functionally divided into two sub-divisions in a VAD mod, and the sub-divisions operate so as to process different sound pickup beams, respectively. The control unit 28 provides an instruction for switching between the normal mode and the VAD mode.

The input/output I/F 21 outputs an audio signal picked up by the sound pickup apparatus to the outside. The input/output I/F 21 can also output the audio signal to the outside after converting the signal into a data format (a protocol) complying with a network and, as a matter of course, can output a digital audio signal in an unmodified form to the outside. The input/output I/F 21 has a built-in D/A converter, as necessary, and can also output an analogue audio signal to the outside.

The respective microphones 11 to 18 of the microphone array may also be omnidirectional or directive. However, it is desirable that the microphones be directive, and the microphones pick up sound from the outside of the sound pickup apparatus and output sound pickup signals S1 to S8 to the respective amplifiers 22.

The respective amplifiers 22 amplify the sound pickup signals S1 through S8 by means of AMPs 22 and provide the signals to the A/D converter 23. The A/D converter 23 digitally converts the sound pickup signals S1 through S8 and outputs digital signals to the digital audio patch 24. The A/D converter 23 can set an individual gain (a ratio of the level of an input analog signal to the level of an output digital signal) for each sound pickup signal, and the gain of each sound pickup signal is set by the control unit 28.

Figure 3A:
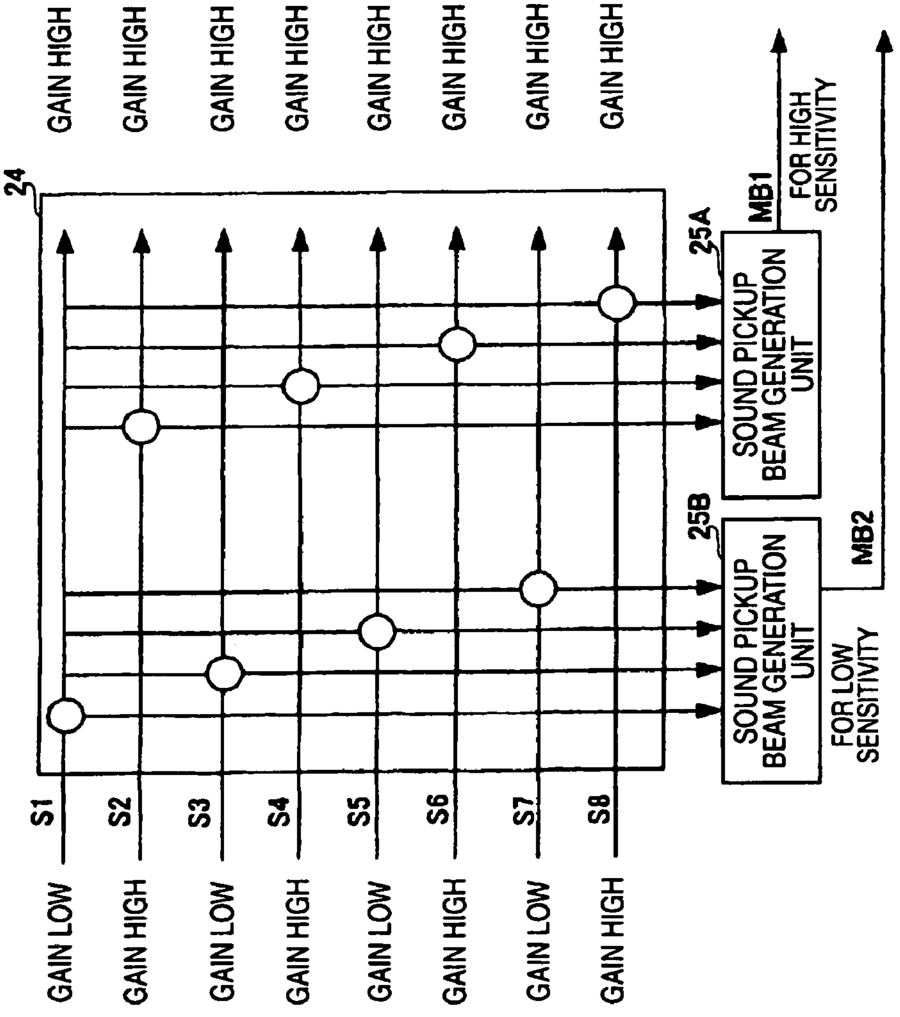
FIGS. 3A-3B are conceptual renderings showing the number and layout of microphones.
Figure 3B:
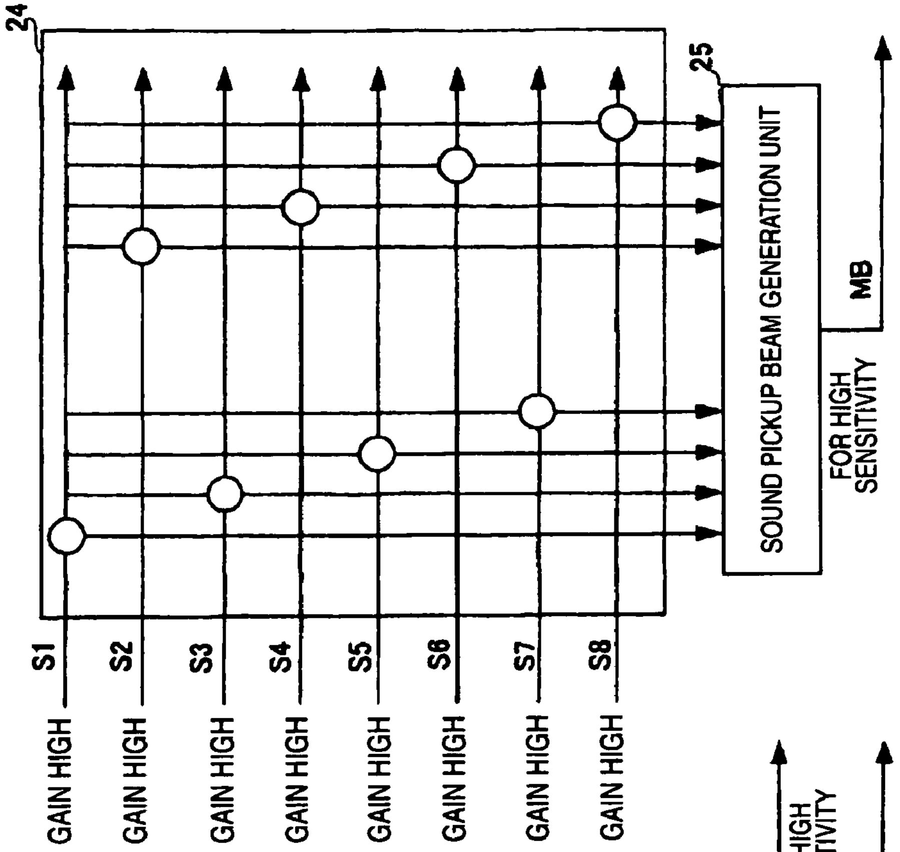

In a normal mode, as shown in FIG. 3B, the digital audio patch 24 outputs the sound pickup signals S1 through S8 to the sound pickup beam generation unit 25. In the VAD mode, the digital audio patch 24 distributively outputs the sound pickup signals S1 through S8 input from the A/D converter 23 to the respective sound pickup beam generation units 25A and 25B, as shown in FIG. 3(A). The digital audio patch 24 can change the number of sound pickup signals, which are distributively output to the respective sound pickup beam generation units 25A and 25B, from zero to eight. The control unit 28 sets the number of sound pickup signals to be output and a combination of sound pickup signals. Specifically, the digital audio patch 24 can freely change the layout of microphones and the number of microphones of the microphone array.

The sound pickup beam generation unit 25 subjects sound pickup signals output from the digital audio patch 24 to predetermined delay processing, thereby generating sound pickup beam signals MB exhibiting high directivity to predetermined directions around the housing 101 (any of the areas 201 to 204).

For instance, on the assumption that an acoustic wave has arrived at all of the microphones at the same timing from the front, sound pickup signals output from the respective microphones are intensified by combination. In the meantime, when acoustic waves arrive at the microphones from directions other than the front, sound pickup signals output from the respective microphones differ from each other in terms of a phase, and hence the sound pickup signals are wakened by combination. Consequently, the sensitivity of the microphone array is narrowed into a beam pattern, whereupon sound pickup beams are generated in only the forward direction.

The sound pickup beam generation unit 25 imparts a predetermined delay time to each of the sound pickup signals, thereby enabling oblique orientation of the sound pickup beams. When the sound pickup beams are slanted, settings are made in such a way that an audio signal is sequentially output from the next microphone every time a predetermined period of time elapses from a microphone disposed at one end. When the sound source is present forward of one end of the microphone array, an acoustic wave comes from the end closest to the sound source and finally arrives at the other end. However, the sound pickup beam generation unit 25 imparts a delay time to the sound pickup signals from the respective microphones so as to make a correction to differences in propagation time and subsequently combine the signals together. The control unit 28 holds information about the positions of microphones corresponding to the respective sound pickup signals and individually control delay times of the respective sound pickup signals. Therefore, an audio signal achieved in a specific direction is enhanced by combination. As mentioned above, audio signals output from the microphones arranged in a line are sequentially delayed from one end to the other end, whereby the sound pickup beam is slanted in accordance with a delay time.

In the VAD mode, the sound pickup beam generation unit 25 is functionally divided into the sound pickup beam generation units 25A and 25B. The sound pickup beam generation units 25A and 25B subject the sound pickup signals output from the digital audio patch 24 to predetermined delay processing, thereby generating sound pickup beam signals MB1 and MB2 exhibiting high directivity toward predetermined directions (any of the areas 201 to 204) around the housing 101. The sound pickup beam signals MB1 and MB2 are generated by gathering sound of the same area at different sensitivity levels. Sound of the same area (any of the areas 201 to 204) is picked up in both the normal mode and the VAD mode; hence, the amount of delay imparted to each of the sound pickup signals assumes an identical value regardless of whether the present mode is the normal mode or the VAD mode.

The sound pickup beam generation unit 25 outputs the sound pickup beam signal MB to the FIFO memory 26 and the sound detector 27 in the normal mode. The sound pickup beam generation units 25A and 25B achieved in the VAD mode output the sound pickup beam signals MB1 and MB2 to the functionally-divided FIFO memory 26A and 26B. Moreover, the sound pickup beam generation units 25A and 25B output the sound pickup beam signals MB1 and MB2 to the sound detector 27.

The FIFO memory 26 sequentially stores the input sound pickup beam signals MB. The FIFO memory 26 outputs, in sequence from the past, the stored sound pickup beam signals MB to the encoder 29. The output timing (cycle) is designated by the control unit 28. The sound pickup beam signals MB are thereby buffered in the FIFO memory 26 for a given period of time. The FIFO memory 26A and 26B achieved in the VAD mode sequentially store the input sound pickup beam signals MB1 and MB2 and output, in sequence from the past, the sound pickup beam signals MB1 and MB2 to the encoder 29. Output timing (a cycle) is designated by the control unit 28 even in this case. The sound pickup beam signals MB1 and MB2 are thereby buffered in the FIFO memory 26A and 26B for a given period of time.

The sound detector 27 detects signal levels of the input sound pickup beam signals MB. The sound detector 27 determines, on the basis of the detected signal levels, whether or not sound is present. Specifically, when the signal levels of the sound pickup beam signals change from a level that is less than the predetermined threshold value to a level that is equal to or greater than the threshold value (when the signal levels become equal to or greater than the threshold values), the sound detector 27 determines occurrence of a change from silence to presence of sound. In the meantime, in the case where the signal levels of the sound pickup beam signals change from the level that is equal to or greater than the predetermined threshold value to the level that is less than the threshold value, the sound detector 27 determines occurrence of a change from presence of sound to silence only when the signal levels remain at the level that is less than the threshold value for a predetermined of time or longer. When the period of time during which the signal levels become less than the threshold value is shorter than the predetermined period of time, presence of sound is determined to be continual. A determination result is output to the control unit 28.

The sound detector 27 detects signal levels of the sound pickup beam signals MB1 and MB2 input in the VAD mode, respectively. The sound detector 27 determines whether or not sound is present on the basis of the signal level of the high-sensitivity sound pickup beam signal MB1. A determination result is output to the control unit 28.

The encoder 29 compresses the sound pickup beam signal MB input from the FIFO memory 26 in the normal mode and outputs the thus-compressed signal to the input/output I/F 21. The sound compression scheme may also be based on any scheme; for instance, ITU-T G.711.

In the VAD mode, the encoder 29 subjects any of the sound pickup beam signals MB1 and MB2 input from. the FIFO memory 26A and 26B to sound compression and outputs the thus compressed signal to the input/output I/F 21. The control unit 28 makes a setting as to which one of the sound pickup beam signals MB1 and MB2 is output after being compressed. The control unit 28 makes a setting as to whether or not the encoder 29 performs sound compression. Specifically, the control unit 28 receives from the sound detector 27 a determination as to whether or not sound is present. When sound is determined not to be present, the control unit 28 makes a setting such that the encoder 29 does not perform sound compression and output compressed sound to the input/output I/F 21.

The sound pickup beam signals MB1 and MB2 are buffered in the FIFO memory 26A and 26B for a predetermined period of time. Hence, when the control unit 28 sends the encoder 29 a command to perform switching to presence-of-sound compression upon receipt of, from the sound detector 27, a determination result showing a change from silence to presence of sound, a break does not arise in sound acquired at start-up.

However, when the sensitivity levels of all of the microphones are low and when the signal levels of the sound pickup beam signals MB1 and MB2 are too low, the sound detector 27 cannot make a determination of a change from silence to presence of sound. If the threshold value for determining presence of sound and silence is made smaller, a determination showing presence of sound will be rendered even when a determination showing silence should originally be rendered. In the meantime, when the sensitivity levels of the microphones are high and when the signal levels of the sound pickup beam signals MB1 and MB2 are too high, an allowable input limit is exceeded (clipping arises).

Accordingly, in the sound pickup apparatus of the present embodiment, the number and layout of microphones of the microphone array are changed by the digital audio patch 24. in the VAD mode, to thus set the high-sensitivity sound pickup beam generation unit and the low-sensitivity sound pickup beam generation unit. Occurrence of clipping, which would otherwise be caused when big sound is input during the course of a change from silence to presence of sound, is thereby prevented while a change from silence to presence of sound is detected without fail.

Specific operation of the sound pickup apparatus will be described. FIG. 3 is a conceptual rendering showing the number and layout of microphones, and FIG. 4 is a view showing a sound pickup area where the microphone array picks up sound. FIG. 3(A) is a view showing a processing channel for the VAD mode; the sound pickup signals S1, S3, S5, and S7 are input to the sound pickup beam generation unit 25B; and the sound pickup signals S2, S4, S6, and S8 are input to the sound pickup beam generation unit 25A. FIG. 3(B) is a view showing a processing channel for the normal mode and illustrating an example in which all of the sound pickup signals S1 to S8 are input to the sound pickup beam generation unit 25. When the determination result showing presence of sound is stably input from the sound detector 27 (for a predetermined period of time or longer) without causing clipping, the control unit 28 makes a setting for the normal mode in FIG. 3(B).

In the normal mode, the digital audio patch 24 makes a setting in such a way that all input lines of the microphones 11 to 18 are connected to the sound pickup beam generation unit 25. The A/D converter 23 sets all of the input channels from the microphones 11 to 18 to high gain and outputs the sound pickup signals S1 to S8 at high levels. The settings are commanded by the control unit 28.

The sound pickup beam generation unit 25 combines the high-level sound pickup signals S1 to S8, thereby generating a high-level sound pickup beam signal MB. In this embodiment, the sound pickup beam signal MB corresponds to gathering of sound in the area 202, as shown in; for instance, FIG. 4(B). The sound pickup beam signal MB is input to the FIFO memory 26. The control unit 28 sets output timing of the FIFO memory 26 and outputs the sound pickup beam signal MB buffered in the FIFO memory 26 to the encoder 29.

The sound pickup beam signal MB is input to the sound detector 27. The sound detector 27 detects a signal level of the input sound pickup beam signal MB, thereby determining whether or not sound is present. A determination result as to whether or not sound is present is output to the control unit 28.

When provided with an input of the determination result showing presence of sound from the sound detector 27, the control unit 28 sets the encoder 29 so as to output the sound pickup beam signal MB after subjecting the signal to sound compression. In the normal mode, when provided with an input of the determination result showing a change from presence of sound to silence from the sound detector 27, the control unit 28 shifts to the VAD mode; divides each of the sound pickup beam generation unit 25 and the FIFO memory 26 into two sub-divisions; and commands the A/D converter 23 and the digital audio patch 24 to perform settings such as those described below.

The digital audio patch 24 makes a setting so as to connect the input lines from the microphone 11, the microphone 13, the microphone 15, and the microphone 17 to the sound pickup beam generation unit 25B and to connect the input lines from the microphone 12, the microphone 14, the microphone 16, and the microphone 18 to the sound pickup beam generation unit 25A.

The A/D converter 23 sets the input lines from the microphone 11, the microphone 13, the microphone 15, and the microphone 17 to low gain and outputs the sound pickup signals S1, S3, S5, and S7 at a low level. Further, the A/D converter 23 sets the input lines from the microphone 12, the microphone 14, the microphone 16, and the microphone 18 to high gain and outputs the sound pickup signals S2, S4, S6, and S8 at a high level.

Figure 4A:
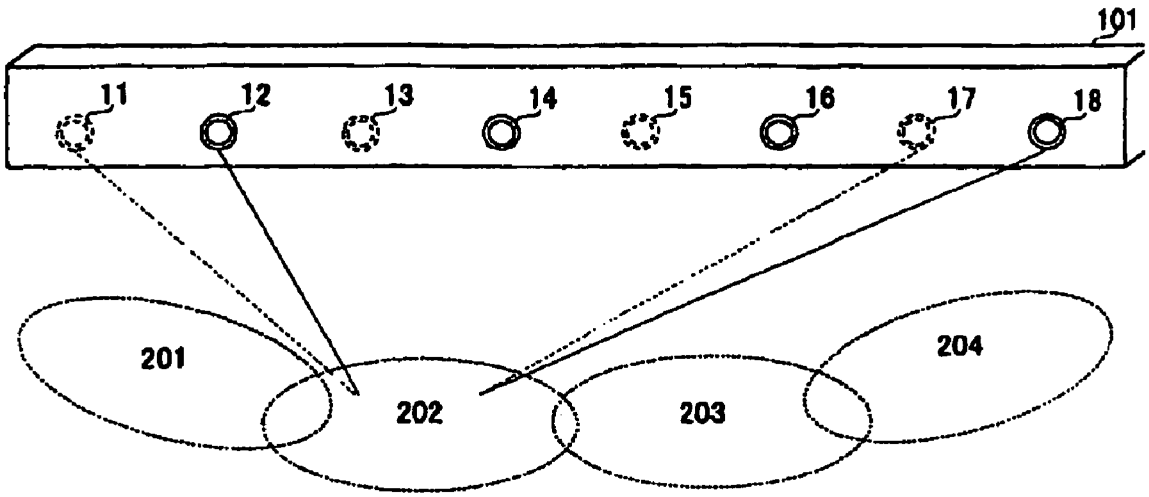
FIGS. 4A-4B are views showing a sound pickup area where sounds are picked up by the microphone array.
Figure 4B:
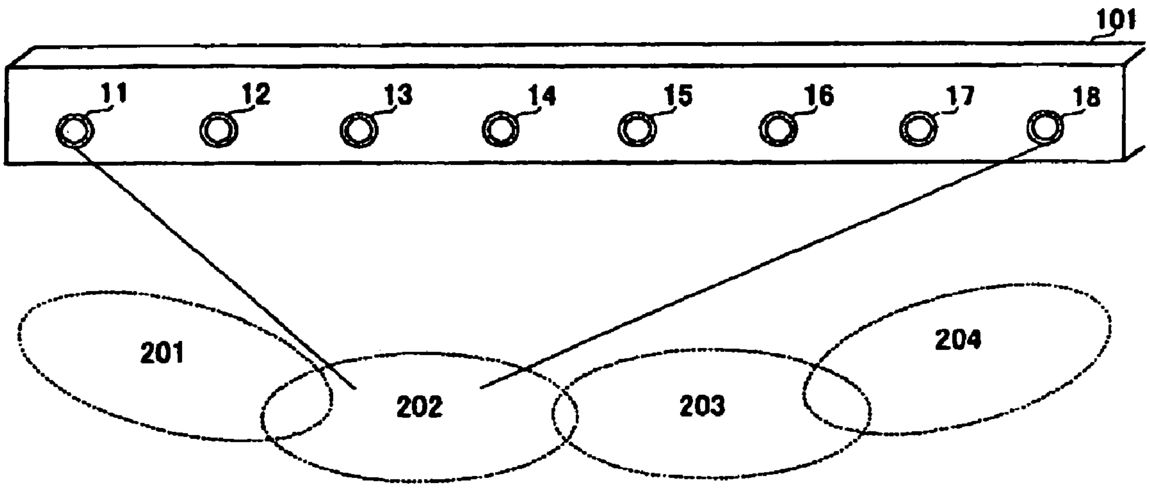

The sound pickup beam generation unit 25A combines the high-level sound pickup signals S2, S4, S6, and S8, thereby generating the high-level sound pickup beam signal MB1. The sound pickup beam generation unit 25B combines the low-level sound pickup signals S1, S3, S5, and S7, thereby generating the low-level sound pickup beam signal MB2. As shown in FIG. 4(A), the sound pickup beam signal MB1 and the sound pickup beam signal MB2 correspond to gathering of sound in the same area (the area 202 in the drawing).

The sound pickup beam signal MB1 is input to the FIFO memory 26A, and the sound pickup beam signal MB2 is input to the FIFO memory 26B. The control unit 28 sets output timing of the FIFO memory 26A and the FIFO memory 26B, and the FIFO memory 26A and the FIFO memory 26B output the buffered sound pickup beam signal MB1 and the buffered sound pickup beam signal MB2 to the encoder 29.

The sound pickup beam signal MB1 and the sound pickup beam signal MB2 are input to the sound detector 27. As mentioned previously, the sound detector 27 detects the signal level of the input sound pickup beam signal MB1 and the signal level of the input sound pickup beam signal MB2, thereby determining whether or not sound is present, and a determination result is output to the control unit 28. In normal times, the sound detector 27 determines, on the basis of the signal level of the high-level sound pickup beam signal MB1, whether or not sound is present. When the signal level of the high-level sound pickup beam signal MB1 is clipped (when an allowable input limit is exceeded), a result showing occurrence of clipping is output to the control unit 28.

When a determination result showing silence is input from the sound detector 27, the control unit 28 sets the encoder 29 so as not to output compressed sound without performance of sound compression. In the meantime, when a determination result showing presence of sound is input from the sound detector 27 without causing clipping, the control unit 28 sets the encoder 29 so as to subject the high-level sound pickup beam signal MB1 to sound compression and output the thus-compressed signal. When a determination result showing presence of sound is input from the sound detector 27 with clipping, the control unit 28 sets the encoder 29 so as to subject the low-level sound pickup. beam signal MB2 to sound compression and output the thus-compressed signal. Further, when a determination result showing presence of sound is stably input from the sound detector 27 without causing clipping (for a given period of time or longer), the control unit 28 shifts from the VAD mode to the normal mode.

As mentioned above, the sound detector 27 enables reliable detection of a change from silence to presence of sound on the basis of the signal level of the high-level sound pickup beam signal MB1. When big sound is input during the course of a change from silence to presence of sound, the control unit 28 sets the encoder 29 so as to subject the low-level sound pickup beam signal MB2 to sound compression and output the thus-compressed signal; hence, sound without distortion, or the like, is output to the outside. As a matter of course, since the sound pickup beam signal MB1 and the sound pickup beam signal MB2 are buffered in the FIFO memory 26A and the FIFO memory 26B, occurrence of a break in sound at start-up, which would otherwise be caused when the control unit 28 receives a determination result showing a change from silence to presence of sound and commands the encoder 29 to perform switching to presence-of-sound compression, does not arise.

When the sound detector 27 stably outputs a determination result showing presence of sound without causing clipping (for a predetermined period of time or longer), a shift to the normal mode arises, and sound pickup beams are generated by use of all of the microphones 11 to 18. Hence, sound quality is improved, and voice of a speaker can be picked up without fail. When the sound detector 27 outputs a determination result showing a change from presence of sound to silence, the control unit 28 shifts to the VAD mode. Hence, when silence suppression is performed, occurrence of clipping can be prevented while a determination of a change from silence to presence of sound is made without fail by means of the high-level sound pickup beam signal and the low-level sound pickup beam signal. When presence-of-sound compression is performed, voice of the speaker can be picked up without fail by means of sound pickup beam signals with high sound quality from all of the microphones, and the thus-picked up voice can be output.

The above embodiment provides an example in which the control unit 28 generates a high-level sound pickup beam signal and a low-level sound pickup beam signal by individually setting gains of respective input/output lines of the A/D converter 23; however, a single gain may also be set for all of the lines of the A/D converter 23. In this case, the essential requirement is to make a setting such that the sound pickup beam generation unit 25A and the sound pickup beam generation unit 25B differ from each other in terms of gain (the level of an output signal to each of the sound pickup signals). The essential requirement is that, even when sound pickup signals of the same level are input, the sound pickup beam generation unit 25A should output a high-level sound pickup beam signal and that the sound pickup beam generation unit 25B should output a low-level sound pickup beam signal.

The invention claimed is:

1. A sound pickup apparatus comprising:

a microphone array formed from an arrangement of a plurality of microphones;

a signal distribution unit which inputs audio signals picked by the plurality of microphones and distributively outputs the audio signal;

first and second sound pickup signal processing units which respectively generate first and second sound pickup beams exhibiting directivity toward a same area in accordance with the audio signals distributively output by the signal distribution unit;

a level setting unit which sets, to a high level, sensitivity of the first sound pickup beam generated by the first sound pickup signal processing unit and setting, to a low level, sensitivity of the second sound pickup beam generated by the second sound pickup signal processing unit;

first and second memories which respectively store the first and second sound pickup beams generated by the first and second sound pickup signal processing units;

a sound determination unit which detects a signal level of the first sound pickup beam generated by the first sound pickup signal processing unit and a signal level of the second sound pickup beam generated by the second sound pickup signal processing unit, determines whether or not sound is present from the detected signal levels, and detects whether or not the first sound pickup beam exceeds an allowable input limit;

a selector which reads the sound pickup beams stored in the first and second memory and selectively outputting any of the sound pickup beams; and a control unit which makes a setting such that, when the sound determination unit does not detect that the first sound pickup beam exceeds the allowable input limit, the high-sensitivity sound pickup beam stored in the first memory is output to the selector at timing at which a determination is changed from silence to presence of sound, and such that, when the sound determination unit detects that the first sound pickup beam exceeds the allowable input limit, the second sound pickup beam stored in the second memory is output to the selector at timing at which a determination is changed from silence to presence of sound.

2. The sound pickup apparatus according to claim 1, wherein, when the sound determination unit holds a determination showing presence of sound for a predetermined period of time or longer, the control unit performs normal output processing for:

commanding the signal distribution unit to output audio signals picked by all microphones to single sound pickup signal processing unit;

commanding the level setting a unit to set the sound pickup beam generated by the sound pickup signal processing unit to high sensitivity; and commanding the selector to output a high-sensitivity sound pickup beam.

3. The sound pickup apparatus according to claim 2, wherein, when the sound determination unit changes a determination from presence of sound to silence, the control unit changes processing from the normal output processing to a detection mode for:

commanding the signal distribution unit to distributively output the audio signal to the first and second signal processing units;

commanding the level setting unit to set the sensitivity of the first sound pickup beam generated by the first sound pickup signal processing unit to high sensitivity and to set the sensitivity of the second sound pickup beam generated by the second sound pickup signal processing unit to low sensitivity; and setting the selector so as to:

when the sound determination unit does not detect that the first sound pickup beam exceeds the allowable input limit, output the first sound pickup beam at timing at which the determination is changed from silence to presence of sound, and when the sound determination unit detects that the first sound pickup beam exceeds the allowable input limit, output the second sound pickup beam at timing at which the determination is changed from silence to presence of sound.

4. The sound pickup apparatus according to claim 1, wherein the level setting unit changes levels of audio signals picked by the plurality of microphones and inputs the audio signals to the sound pickup signal processing unit, thereby setting the first and second sound pickup beams to high sensitivity or low sensitivity.

5. The sound pickup apparatus according to claim 1, wherein the level setting unit changes a ratio of an input level to an output level of each of the first and second sound pickup signal processing unit, thereby setting the first and second sound pickup beams to high sensitivity or low sensitivity, respectively.

* * * * *